United States Patent [19]
Rexer

[11] Patent Number: 5,317,184
[45] Date of Patent: May 31, 1994

[54] DEVICE AND METHOD FOR IMPROVING CURRENT CARRYING CAPABILITY IN A SEMICONDUCTOR DEVICE

[75] Inventor: Christopher L. Rexer, Mountaintop, Pa.

[73] Assignee: Harris Corporation, Melbourne, Fla.

[21] Appl. No.: 973,709

[22] Filed: Nov. 9, 1992

[51] Int. Cl.$^5$ .................. H01L 27/01; H01L 21/44
[52] U.S. Cl. ........................ 257/401; 257/328; 257/329; 257/331; 257/341; 257/773; 257/923; 437/180; 437/203
[58] Field of Search ............... 257/328, 329, 331, 341, 257/401, 923; 437/180, 203

[56] References Cited
FOREIGN PATENT DOCUMENTS
0439165 7/1991 European Pat. Off. ............ 257/331

*Primary Examiner*—Edward Wojciechowicz
*Attorney, Agent, or Firm*—Rogers & Killeen

[57] ABSTRACT

Semiconductor devices with elongated well regions in a stripe geometry pattern include uniformly sized source exclude areas that are longitudinally offset with respect to source exclude areas in adjacent well regions. The uniformity of the current density in neck regions is increased, thereby increasing the current carrying capability of the device.

22 Claims, 1 Drawing Sheet

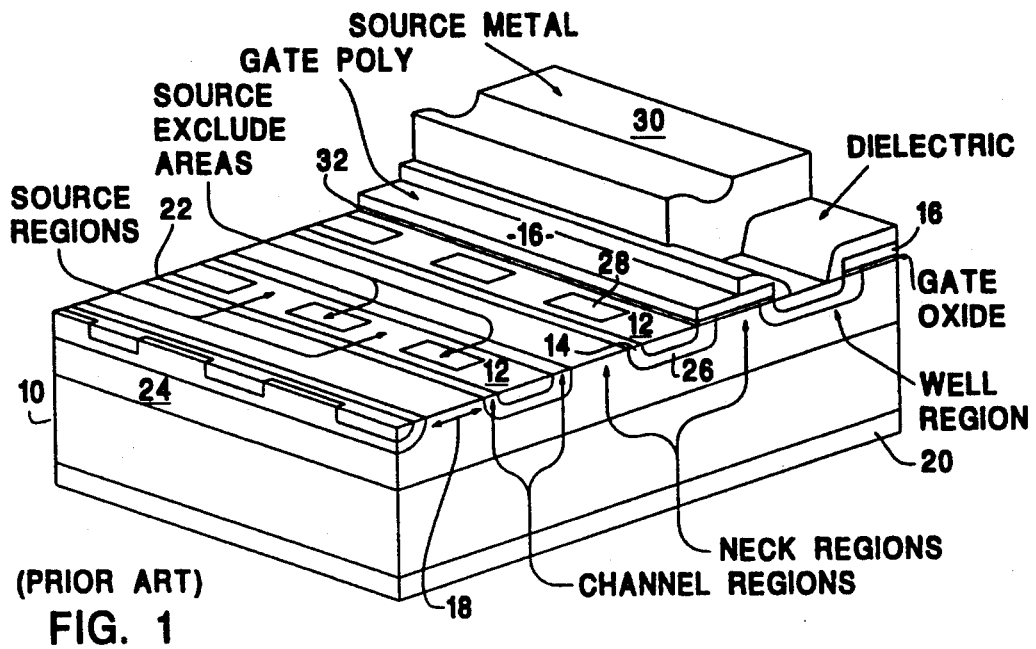
(PRIOR ART)
FIG. 1
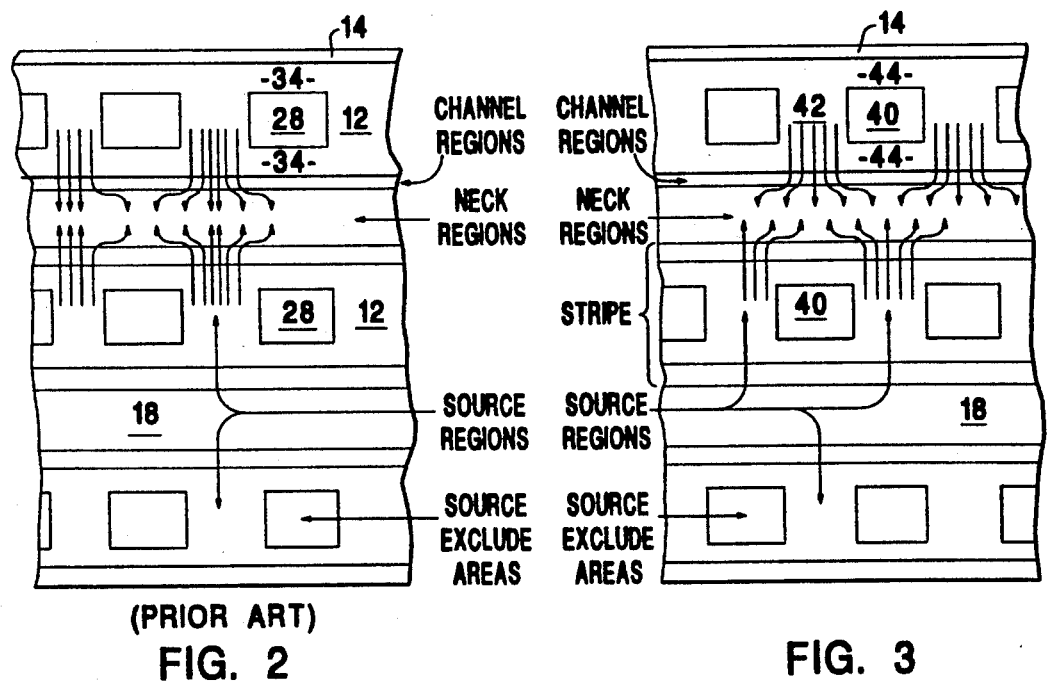
(PRIOR ART)
FIG. 2
FIG. 3

DEVICE AND METHOD FOR IMPROVING CURRENT CARRYING CAPABILITY IN A SEMICONDUCTOR DEVICE

BACKGROUND OF THE INVENTION

The present invention relates to semiconductor devices, and more particularly to semiconductor devices and methods for improving the current carrying capability of semiconductor devices having a stripe geometry pattern on a surface thereof.

Semiconductor devices, and more particularly metal oxide semiconductor (MOS) devices used in power applications, are operated when an electric potential is applied across a drain and a source and a voltage is applied to a gate to control current flow between the drain and the source. With reference to FIG. 1, electron flow in such semiconductor devices 10 of the prior art is from a source region 12, laterally through a channel region 14 (formed in the depletion region under the gate electrode 16), to a neck region 18 and vertically to the drain 20.

Semiconductor devices 10 of the prior art include a wafer with a silicon region 24 of a first semiconductor type. Well regions 26 of a second semiconductor type are patterned and implanted and/or diffused into the silicon region 24. Within each of the well regions 26 are patterned source regions 12 that do not extend into the silicon region 24. The edges of the well regions 26 and source regions 24 form the channels 14. The edges of the well regions 26 define the boundaries of the stripe geometry pattern. Portions of the well region 26 are masked when the source regions are formed so that the masked portions are excluded from the source region doping. These source exclude areas 28 provide locations for contact of the well regions 26 with the device source metal 30. A gate oxide layer is formed over both the neck regions 18 and the channel regions 14, and a polysilicon layer 16, which serves as the gate electrode, is deposited over the gate oxide regions.

As may be seen more clearly in FIG. 2 that is a plan view of the surface 22 of a semiconductor device of the prior art with the gate oxide, gate and source metal removed, the source exclude areas 28 are placed directly across from each other in adjacent source regions 12. As a result of this design, the lateral current flow in the surface of the device from the source regions 12 to the neck regions 18 does not have a uniform density. As may be seen by the dispersion of the arrows in FIG. 2, current density is greatest in the portion of the neck region between opposing source regions 12, and the density is least in the portion of the neck region between opposing source exclude areas 28. In other words, the design of the prior art produces current crowding in portions of the neck region that causes a larger portion of the device current to flow laterally to the portions 34 of the neck regions between the source exclude areas 28 and the channel 14, thereby increasing the device on-resistance. As is known, increased on-resistance generally decreases the current carrying capability of the device.

The portions 34 between the source exclude areas 28 and the channels 14 do not conduct as efficiently as the larger areas between source exclude areas 28 because the electron path is longer and the portions have a small cross-sectional area. The resistive voltage drop contributed by increased current flow in region 34 adds to the on-resistance of the device.

Accordingly, it is an object of the present invention to provide a novel device and method for increasing the current carrying capability of a semiconductor device with a striped geometry.

It is a further object of the present invention to provide a novel device in which the source exclude areas in adjacent well regions are offset to increase the uniformity of the current density in the neck regions.

It is yet a further object of the present invention to provide a novel method for enhancing the current carrying capability of a semiconductor device by increasing the uniformity of current density in the neck regions.

It is another object of the present invention to provide a novel method for reducing on-resistance in a semiconductor device by increasing the uniformity of current density in the neck regions.

It is yet another object of the present invention to provide a novel method of reducing on-resistance in a semiconductor device by offsetting source exclude areas in adjacent well regions.

These and many other objects and advantages of the present invention will be readily apparent to one skilled in the art to which the invention pertains from a perusal of the claims, the appended drawings, and the following detailed description of preferred embodiments.

BRIEF DESCRIPTION OF THE DRAWINGS

FIG. 1 is a partial pictorial representation of a semiconductor device of the prior art.

FIG. 2 is a partial plan view of the semiconductor device of FIG. 1 illustrating directly opposed source exclude areas.

FIG. 3 is a partial plan view of an embodiment of the present invention illustrating offset source exclude areas.

DETAILED DESCRIPTION OF THE PREFERRED EMBODIMENTS

With reference now to FIG. 3, the current invention may find application in semiconductor devices having a striped geometry on a surface thereof. In contrast to the prior art, the source exclude areas 40 of the present invention are offset from one another in adjacent source regions 42. In other words, the source exclude areas 40 in adjacent source regions 42 are staggered so they are not directly opposed as in prior art devices illustrated in FIG. 2.

As may be seen by the dispersion of the arrows in FIG. 3, current crowding in the neck region 18 is reduced so that current density is more uniform throughout the neck region. This pattern reduces the current flow in the relatively narrow source regions 44 between the source exclude areas 40 and the channels 14.

By offsetting the source exclude areas 40 in adjacent source regions 42 with the respect to each other, more current flows in the larger, more efficiently conducting areas of the source region 42, rather than in the small, less efficient conducting portions 44, thereby reducing the resistive voltage drop associated with the prior art portions 34 and reducing the on-resistance. Because the on-resistance is reduced, the current carrying capability of a semiconductor device incorporating the present invention is increased over that of a prior art semiconductor device of a similar size.

While the distance the source exclude areas 40 are offset may vary, it has been found that satisfactory results are achieved when the source exclude areas 40 are offset by a distance equal to approximately one-half the space between them, and when the source exclude areas 40 in source regions 12 separated by one other well region 12 are not offset. (The same offset is achieved when source exclude areas in one source region are shifted by the full distance between the source exclude areas.) While the source exclude areas are depicted in FIG. 3 as being generally rectangular, other shapes known in the art may be used. Further, the present invention may be used in N-type or P-type devices.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A semiconductor device comprising:
   a wafer of a first conductivity type with a plurality of elongated well regions of a second conductivity type therein spaced apart by neck regions of said first conductivity type,
   each of said well regions having an elongated source region of said first conductivity type along the length thereof, said source region excluding a plurality of uniformly sized, centrally located source exclude areas spaced longitudinally along the length thereof,
   said source exclude areas of adjacent ones of said well regions being offset longitudinally with respect to each other to thereby increase the uniformity of current density in said neck regions.

2. The device of claim 1 wherein said offset is approximately one-half the spacing between said source exclude areas.

3. The device of claim 1 wherein said source exclude areas are generally rectangular.

4. The device of claim 3 wherein the spacing between said source exclude areas is approximately equal to the length of said source exclude areas.

5. The device of claim 1 wherein said source exclude areas in alternating ones of said well regions are not offset longitudinally with respect to each other.

6. The device of claim 1 wherein the semiconductor device is a MOS gated device.

7. The device of claim 6 wherein said source exclude areas are generally rectangular, wherein said offset is approximately one-half the spacing between said source exclude areas, and wherein the spacing between said source exclude areas is approximately equal to the length of said source exclude areas.

8. The device of claim 7 wherein said source exclude areas in alternating ones of said well regions are not offset longitudinally with respect to each other.

9. A semiconductor device comprising a wafer of a first semiconductor type having plural spaced-apart striped well regions of a second semiconductor type each with plural source contact areas therein that are separated from one another by source regions of the first semiconductor type, wherein said plural source contact areas of adjacent ones of said plural striped well regions are offset with respect to each other.

10. The device of claim 9 wherein said offset is approximately one-half the distance between adjacent ones of said plural source contact areas.

11. The device of claim 9 wherein said source contact areas in ones of said striped well regions separated from each other by another one of said striped well regions are not offset with respect to each other.

12. The device of claim 9 wherein said source contact areas have a generally uniform rectangular shape.

13. The device of claim 9 wherein the spacing between said source contact areas is approximately equal to the length of said source contact areas.

14. The device of claim 9 wherein the semiconductor device is a MOS gated device.

15. The device of claim 14 wherein said source contact areas are generally rectangular, wherein said offset is approximately one-half the spacing between said source contact areas, and wherein the spacing between said source contact areas is approximately equal to the length of said source contact areas.

16. The device of claim 15 wherein said source contact areas in alternating ones of said well regions are not offset longitudinally with respect to each other.

17. In a semiconductor device having a wafer of a first conductivity type with a plurality of elongated parallel well regions of the opposite conductivity type therein so that adjacent ones of said well regions are separated by a neck region of said wafer, where each of said well regions has an elongated source region of said first conductivity type extending longitudinally thereof, said source region excluding a plurality of uniformly sized, centrally located, longitudinally spaced source exclude areas, the method of enhancing the current carrying capacity of the device by increasing the uniformity of current density in said neck regions by offsetting said source exclude areas in adjacent ones of said well regions.

18. The method of claim 17 wherein the offset is one-half the spacing of said source exclude areas.

19. The method of claim 18 wherein the semiconductor device is a MOS gated device.

20. In a semiconductor device having a wafer of a first semiconductor type with plural spaced-apart striped well regions of a second semiconductor type therein, each of the well regions having plural source exclude areas therein separated from one another by source regions of the first semiconductor type, the method of decreasing the on-resistance of the semiconductor device comprising the steps of offsetting the location of the source exclude areas in adjacent ones of the well regions.

21. The method of claim 20 wherein the offset is one-half of the spacing between said source exclude areas.

22. The method of increasing the current carrying capacity of a semiconductor device having a plurality of spaced stripes of a first semiconductor type each having plural source contact areas therein separated from each other by source regions of a second semiconductor type, comprising the step of offsetting said source contact areas in adjacent ones of said stripes to increase the uniformity of the density of the current in space between said stripes.

* * * * *